(12) United States Patent
Lundy

(10) Patent No.: US 11,945,370 B2
(45) Date of Patent: Apr. 2, 2024

(54) REARVIEW ASSEMBLY WITH PIEZO VIBRATION DAMPENING

(71) Applicant: GENTEX CORPORATION, Zeeland, MI (US)

(72) Inventor: Eric S. Lundy, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 321 days.

(21) Appl. No.: 17/242,732

(22) Filed: Apr. 28, 2021

(65) Prior Publication Data

US 2021/0339680 A1   Nov. 4, 2021

Related U.S. Application Data

(60) Provisional application No. 63/018,610, filed on May 1, 2020.

(51) Int. Cl.
| | |
|---|---|
| *B60R 1/08* | (2006.01) |
| *B60R 1/04* | (2006.01) |
| *B60R 1/12* | (2006.01) |
| *G02F 1/1333* | (2006.01) |
| *G02F 1/137* | (2006.01) |

(Continued)

(52) U.S. Cl.
CPC ............... *B60R 1/088* (2013.01); *B60R 1/04* (2013.01); *B60R 1/12* (2013.01); *G02F 1/13338* (2013.01); *G02F 1/13756* (2021.01); *G02F 1/157* (2013.01); *H10N 30/302* (2023.02); *H10N 30/802* (2023.02); *H10N 30/88* (2023.02);

(Continued)

(58) Field of Classification Search
CPC ............ B60R 1/088; B60R 2001/1215; G02F 1/13756
USPC ......................................................... 349/195
See application file for complete search history.

(56) References Cited

U.S. PATENT DOCUMENTS

| | | | |
|---|---|---|---|
| 4,786,861 A | 11/1988 | Hulsing, II et al. | |
| 2010/0201816 A1* | 8/2010 | Lee .......................... | B60R 1/12 349/1 |
| 2016/0097959 A1 | 4/2016 | Bruizeman et al. | |

FOREIGN PATENT DOCUMENTS

| | | |
|---|---|---|
| CN | 107976252 A | 5/2018 |
| EP | 0330693 B1 | 1/1994 |

(Continued)

OTHER PUBLICATIONS

International Search Report dated Jul. 22, 2021, for corresponding PCT application No. PCT/US2021/029591, 2 pages.

(Continued)

*Primary Examiner* — Edward J Glick
*Assistant Examiner* — William D Peterson
(74) *Attorney, Agent, or Firm* — Price Heneveld LLP; Brian James Brewer

(57) ABSTRACT

A rearview assembly is disclosed. The rearview assembly comprises a reflective element and/or a display element. Further, the rearview assembly comprises an array of piezo-electric sensors. The array of piezo-electric sensors may be operable to sense a first vibration. Further, based, at least in part, on sensing the first vibration, the array of piezo-electric sensors may be operable to output a second vibration. In some embodiments, the second vibration may be operable to substantially dampen the first vibration. In other embodiments, the second vibration may be operable to provide (Continued)

haptic feedback to a user interfacing with a touch screen surface of the rearview assembly.

20 Claims, 6 Drawing Sheets

(51) Int. Cl.
*G02F 1/157* (2006.01)
*H10N 30/30* (2023.01)
*H10N 30/80* (2023.01)
*H10N 30/88* (2023.01)

(52) U.S. Cl.
CPC ................ *B60R 2001/1215* (2013.01); *B60R 2001/1223* (2013.01); *G02F 2203/09* (2013.01)

(56) References Cited

FOREIGN PATENT DOCUMENTS

| | | | |
|---|---|---|---|
| JP | 60135344 A | | 7/1985 |
| JP | S60135344 A | * | 7/1985 |
| JP | 2003231294 A | * | 8/2003 |
| JP | 2003231294 A | | 8/2003 |

OTHER PUBLICATIONS

Written Opinion dated Jul. 22, 2021, for corresponding PCT application No. PCT/US2021/029591, 5 pages.

* cited by examiner

REARVIEW ASSEMBLY WITH PIEZO VIBRATION DAMPENING

CROSS-REFERENCE TO RELATED APPLICATIONS

This application claims priority under 35 U.S.C. § 119(e) to U.S. Provisional Application No. 63/018,610 filed on May 1, 2020, entitled "REARVIEW ASSEMBLY WITH PIEZO VIBRATION DAMPENING," the disclosure of which is hereby incorporated by reference in its entirety.

FIELD OF INVENTION

The present invention generally relates to a rearview assembly and, more particularly, to a rearview assembly with vibration dampening.

BACKGROUND OF INVENTION

Vehicles typically include a rearview assembly, such as a rearview mirror, to allow a driver of the vehicle to observe an area behind the vehicle. Further, theses rearview assemblies, with increasing frequency, are incorporating additional product features, such as displays and electro-optics. These additional product features may increase the usefulness the rearview assembly. However, these additional product features have the problematic effect of increasing the mass of the rearview assembly. Further, as mass increases, the magnitude of vibrations experienced by the rearview assembly may likewise increase. These vibrations substantially diminish the viewability of the rearview assembly, particularly as the vibrational magnitude increases. Accordingly, there is a need for an improved rearview assembly.

SUMMARY

In accordance with the present disclosure, the problems associated with rearview assemblies experiencing vibrations detrimental to the viewability of the rearview assembly have been substantially reduced or eliminated.

According to one aspect of the present disclosure, a rearview assembly is disclosed. The rearview assembly may comprise a sub-assembly, an array of piezo-electric sensors, and a controller. The sub-assembly may comprise a reflective element. The array of piezo-electric sensors may comprise at least one piezo-electric sensor in each of an x, y, and z direction. Further, each piezo-electric sensor may be operable to output: a first signal based, at least in part, on sensing a first vibration, and a second vibration in response to receiving a second signal. In some embodiments, the piezo-electric sensors may be physically and vibrationally coupled to the sub-assembly, such that they vibrate substantially synchronously. Additionally or alternatively, the components of the sub-assembly may be coupled together such that they substantially vibrate synchronously. The controller may be communicatively connected to the array of piezo-electric sensors. Further, the controller operable, relative each of the piezo-electric sensors, to: receive the first signal; generate the second signal based, at least in part, on the first signal; and communicate the second signal to the piezo-electric sensor. Additionally, the second signal may determine the second vibration. Further, the second vibration may be substantially out of phase with the first vibration. In some embodiments, the second vibration may be substantially out of phase with the first vibration by approximately a half wave. Accordingly, the second vibration may be operable to substantially dampen the first vibration.

In some embodiments, the sub-assembly may further comprise an electro-optic element. In some such embodiments, the electro-optic element may be electrochromic. Accordingly, the sub-assembly may have variable reflectance. In some embodiments, the rearview assembly may further comprise a housing. The housing may define a cavity. Further, the sub-assembly may be substantially disposed in the cavity. In some embodiments, the sub-assembly further comprises a display element. Additionally, in some such embodiments, the reflective element is transflective. Additionally or alternatively, the sub-assembly may further comprise a touchscreen surface. In some such embodiments, at least one piezo-electric sensor may be operable to output a third vibration in response to receiving a third signal. Further, the controller may be further operable to: receive a fourth signal from the touchscreen surface, and generate the third signal based, at least in part, on the fourth signal. The fourth signal accordingly may correspond to a touch input from a user.

According to another aspect of the present disclosure, a rearview assembly is disclosed. The rearview assembly, for example, may be an interior rearview assembly. Further, the rearview assembly may comprise: a sub-assembly, an array of piezo-electric sensors, and a controller. The sub-assembly may comprise a display element. The display element may be operable to receive and display an image of a scene rearward a vehicle. The array of piezo-electric sensors may comprise at least one piezo-electric sensor in each of an x, y, and z direction. Further, each piezo-electric sensor may be operable to output: a first signal based, at least in part, on sensing a first vibration, and a second vibration in response to receiving a second signal. In some embodiments the piezo-electric sensor may be vibrationally coupled to the sub-assembly. The controller may be communicatively connected to the array of piezo-electric sensors. Additionally, the controller may be operable, for each of the piezo-electric sensors, to: receive the first signal; generate the second signal based, at least in part, on the first signal, the second signal determining the second vibration, where the second vibration may be substantially out of phase with the first vibration, and communicate the second signal to the piezo-electric sensor. Accordingly, the second vibration may be operable to substantially dampen the first vibration. In some embodiments, the second vibration may be substantially out of phase with the first vibration by a half wave.

In some embodiments, the sub-assembly further may comprise a touchscreen surface. In some such embodiments, at least one piezo-electric sensor may be operable to output a third vibration in response to receiving a third signal. Additionally, the controller may be further operable to: receive a fourth signal from the touchscreen surface, the fourth signal corresponding to a touch input from a user; and generate the third signal based at least in part on the fourth signal.

In some embodiments, the rearview assembly may further comprise an optical element operable to switch between transmissive and reflective states. In some embodiments, the optical element may comprise a twisted pneumatic liquid crystal medium. In other embodiments, the optical element may be an electro-optic element operable to vary the transmittance of light therethrough at one or more wavelengths.

In some embodiments, the rearview assembly may further comprise a housing. The housing may define a cavity. Further, the sub-assembly may be substantially disposed in the cavity.

These and other aspects, objects, and features of the present disclosure will be understood and appreciated by those skilled in the art upon studying the following specification, claims, and appended drawings. It will also be understood that features of each embodiment disclosed herein may be used in conjunction with, or as a replacement for, features in other embodiments.

DETAILED DESCRIPTION

Figure 1A:
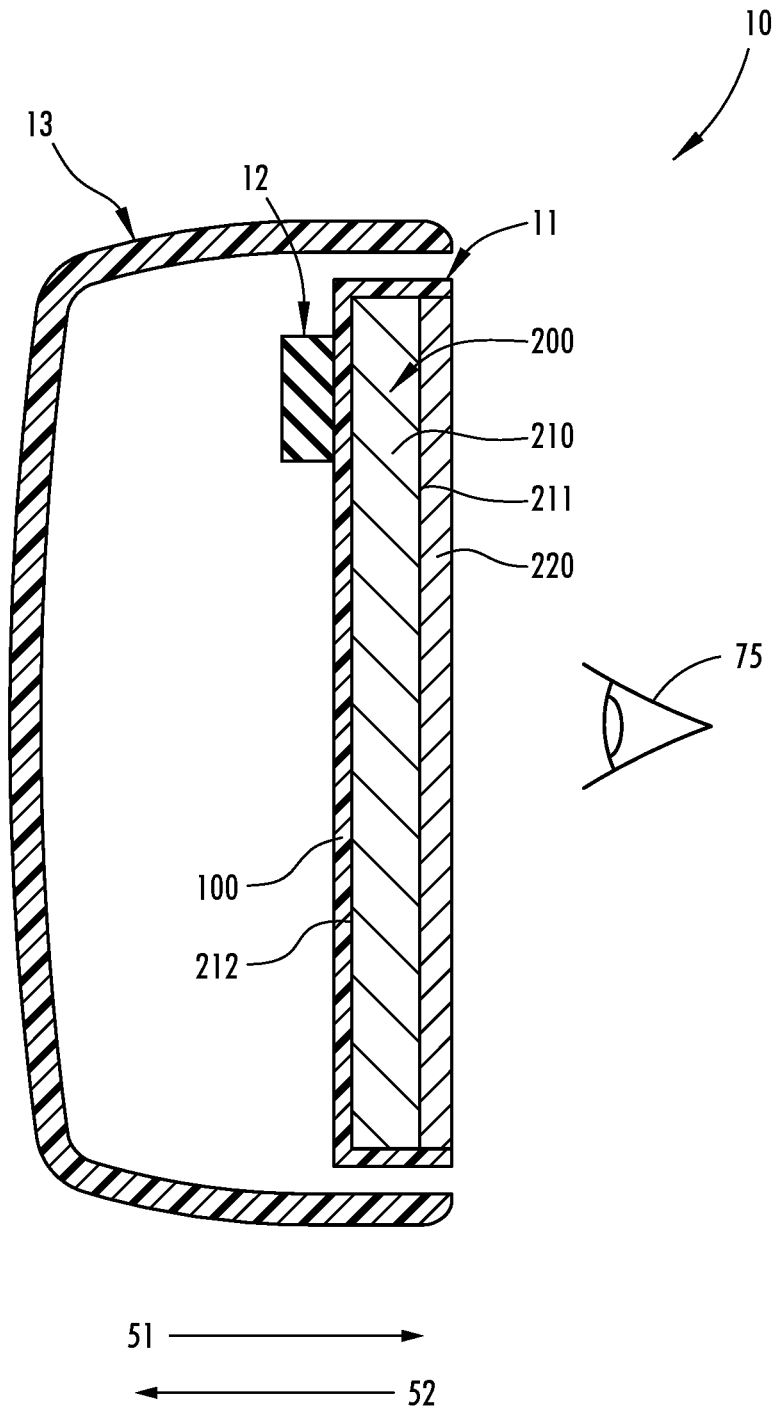
FIG. 1a: A cross-sectional schematic representation of an embodiment of a rearview assembly.

For the purposes of description herein, the specific devices and processes illustrated in the attached drawings and described in this disclosure are simply exemplary embodiments of the inventive concepts defined in the appended claims. Hence, specific characteristics relating the embodiments disclosed herein are not to be considered as limiting, unless the claims expressly state otherwise.

Embodiments of the present disclosure are directed rearview assemblies with vibration dampening. Accordingly, a rearview assembly 10 is disclosed, embodiments of which are shown in FIGS. 1-2.

FIGS. 1a-e, are cross sectional schematic representations of rearview assembly 10. Rearview assembly 10 may comprise a sub-assembly 11, a vibration dampener 12, and/or a housing 13. Further, rearview assembly 10 may be disposed on and/or in a vehicle. For example, rearview assembly 10 may be disposed in areas traditionally associated with interior rearview mirrors.

Sub-assembly 11 may be a single entity where its components are physically coupled relative one another, such that sub-assembly 11 mechanically moves together as a single entity. Thus, the components of sub-assembly 11 may vibrate substantially synchronously. Accordingly, sub-assembly 11 may comprise a carrier 100 to which the components are secured.

Figure 2:
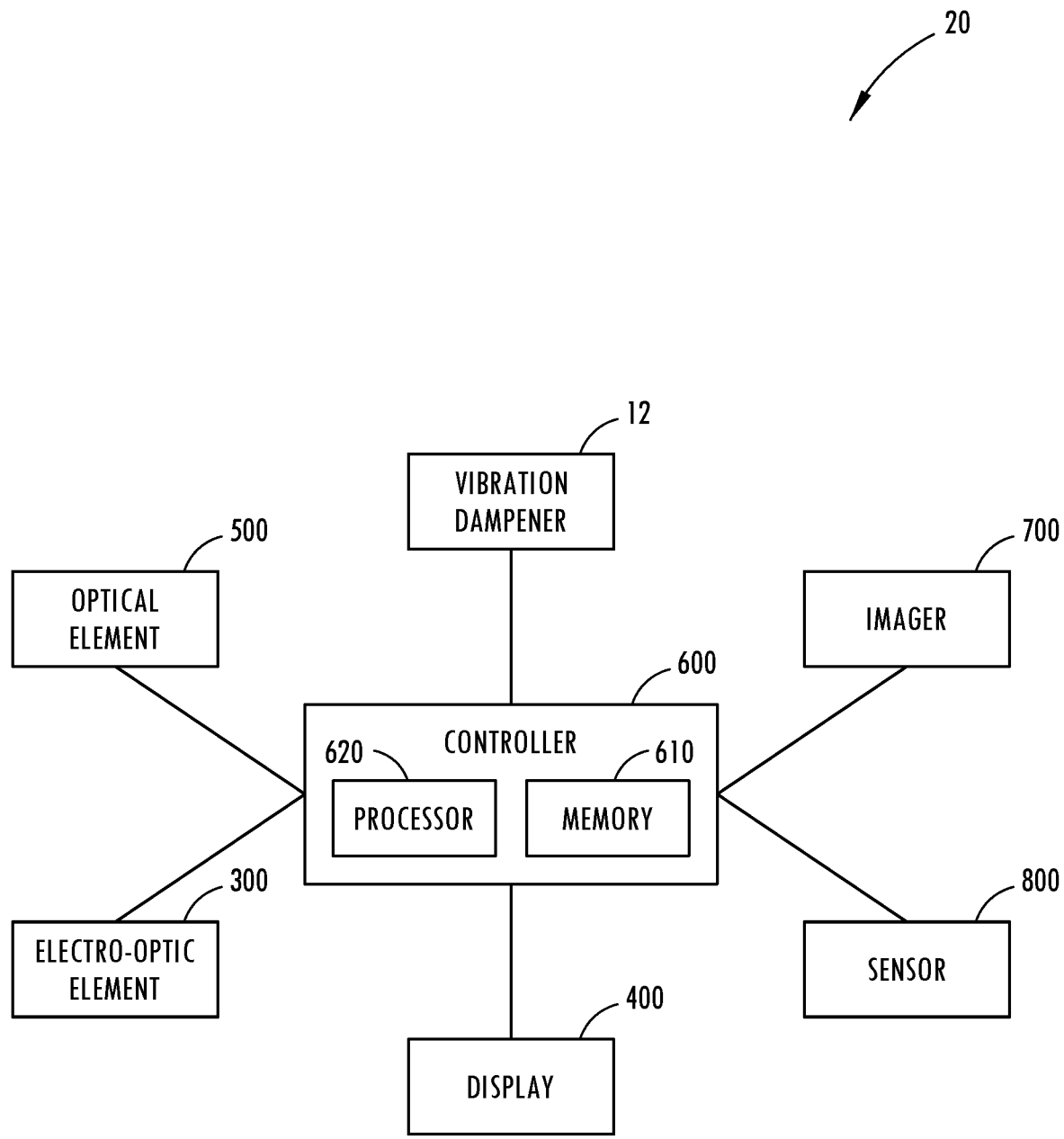
FIG. 2: A schematic representation of a system for an embodiment of a rearview assembly.

In some embodiments, as shown in FIG. 1a, sub-assembly 11 comprises a reflective element 200. Reflective element 200 is an element operable to substantially reflect light in the visible region of the electromagnetic spectrum. Additionally, in some embodiments, reflective element 200 may also be substantially transflective in the visible region of the electromagnetic spectrum. In some embodiments, reflective element 200 may be further operable to provide a user 75 with a view rearward the vehicle. Further, reflective element 200 may comprise a first substrate 210 and a reflective layer 220.

First substrate 210 comprises a first surface 211 and a second surface 212. Further, first surface 211 may be disposed in a first direction 51 relative second surface 212. First substrate 210 may be fabricated from any one of a number of materials operable to have reflective layer 220 associated therewith. For example, first substrate 210 may be fabricated from borosilicate glass, soda lime glass, float glass, natural and synthetic polymeric resins, plastics, and/or composites. In some embodiments, second surface 212 may be associated with and/or adhered to carrier 100.

Reflective layer 220 is a layer operable to substantially reflect light in the visible region of the electromagnetic spectrum. Accordingly, reflective layer 220 may be a mirror. Reflective layer 220 may fabricated from chromium, rhodium, ruthenium, silver, and alloys thereof. In some embodiments reflective layer 220 may be disposed on first surface 211 of first substrate 210. In other embodiments, reflective layer 220 may be disposed on second surface 212. In such an embodiment, first substrate 210 may be substantially transparent in the visible region of the electromagnetic spectrum. Additionally, reflective layer 220 may be associated with and/or adhered to carrier 100.

Figure 1B:
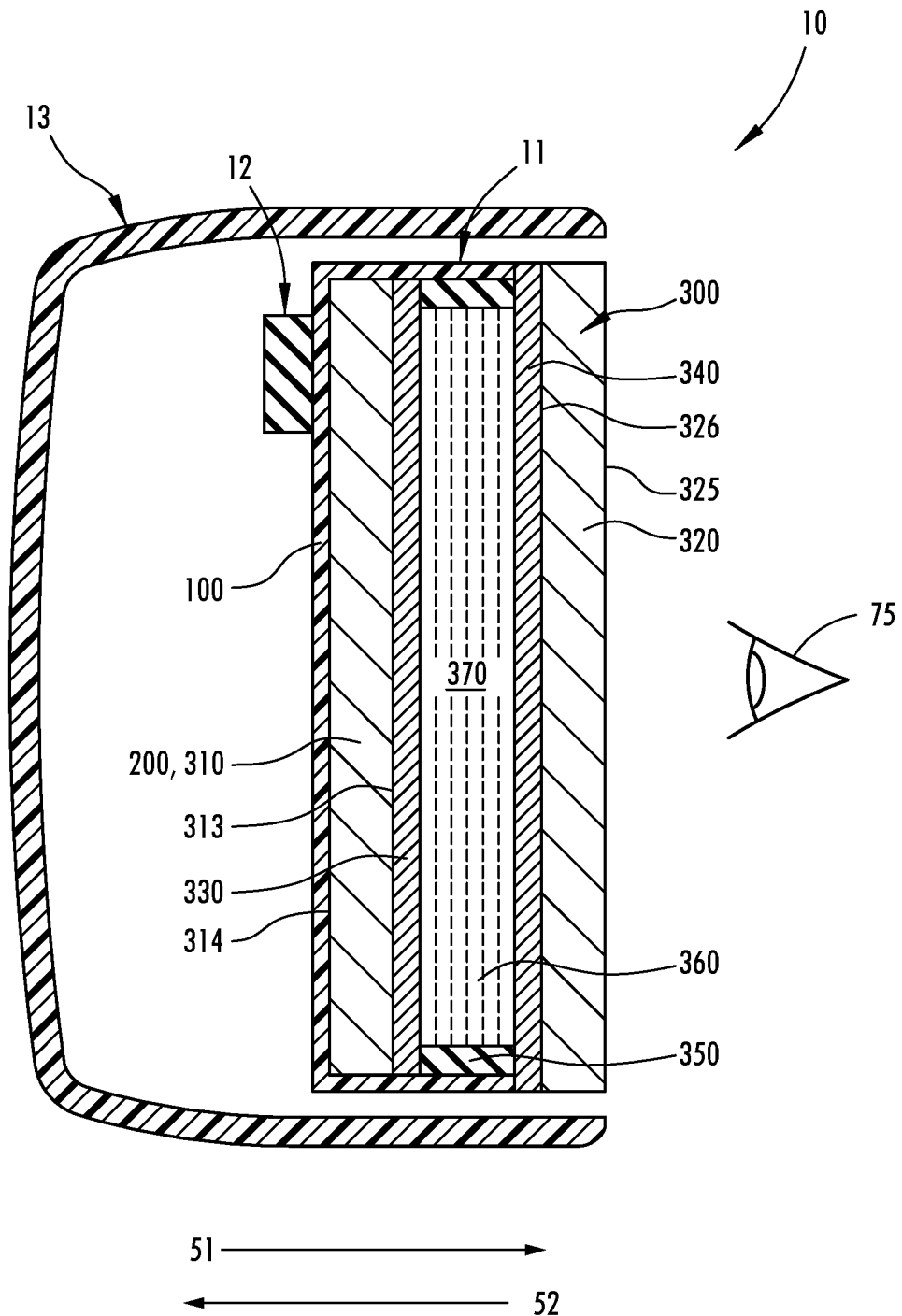
FIG. 1b: A cross-sectional schematic representation of an embodiment of a rearview assembly.

In some embodiments, as shown in FIG. 1b, sub-assembly 11 may further comprise an electro-optic element 300. In some such embodiments, reflective element 200 may be a part of electro-optic element 300. Electro-optic element 300 may be an element operable to vary the reflectance and/or transmittance of light therethrough. Electro-optic element 300 may comprise a second substate 310, a third substrate 320, a first electrode 330, a second electrode 330, a first seal 350, and/or an electro-optic medium 360.

Second substrate 310 comprises a third surface 313 and a fourth surface 314. Third surface 313 may be disposed in the first direction 51 relative fourth surface 314. In some embodiments, second substate 310 may be reflective element 200. Accordingly, in some embodiments, second substrate 310 may be reflective. In other embodiments, electro-optic element 300 may be disposed in the first direction 51 relative reflective element 200. In some such embodiments, second substate 310 is transparent or substantially transparent in the visible region of the electromagnetic spectrum. Further, second substrate 310 may be fabricated from any number of materials such as borosilicate glass, soda lime glass, float glass, natural and synthetic polymeric resins, plastics, and/or composites. In some embodiments, fourth surface 314 may be adhered to carrier 100.

Third substrate 320 may be disposed in a spaced apart relationship and in the first direction 51 relative second substrate 310. Further, third substate 320 is substantially transparent in the visible region of the electromagnetic spectrum and comprises a fifth surface 325 and a sixth surface 326. Fifth surface 325 may be disposed in the first direction 51 relative sixth surface 326. Third substrate 320, for example, may be fabricated from materials suitable for second substrate 310.

First electrode 330 may be associated with third surface 313 of second substate 310. Further, first electrode 330 comprises an electrically conductive material. In some embodiments, the electrically conductive material of first electrode 330 is substantially transparent in the visible region of the electromagnetic spectrum. In such an embodiment, the electrically conductive material, for example, may be a transparent conductive oxide (TCO) such as fluorine doped tin oxide (FTO), indium tin oxide (ITO), aluminum doped zinc oxide (AZO), or indium zinc oxide (IZO). In other embodiments, the electrically conductive material of first electrode 330 is substantially reflective in the visible region of the electromagnetic spectrum. In such an embodiment, the electrically conductive material may be a reflective, conductive metal or metal alloy, such as, chromium, rhodium, ruthenium, silver, and alloys thereof.

Second electrode 340 may be associated with sixth surface 326 of third substate 320. Further, second electrode 340 comprises a substantially transparent, electrically conductive material. The electrically conductive material, for example, may be a TCO, such as, FTO, ITO, AZO, or IZO.

First seal 350 may be disposed in a peripheral manner to define a chamber 370 in combination with one or more of second substrate 310, third substrate 320, first electrode 330, and second electrode 340. Alternatively, first seal 350 may be disposed about and extending between peripheries of the second and third substrates 310, 320. First seal 350 may comprise any material capable of being adhesively bonded to one or more of second substrate 310, third substrate 320, first electrode 330, and second electrode 340 to in turn seal chamber 360, such that an electro-optic medium 370 may not inadvertently leak out of chamber 360.

Electro-optic medium 370 is disposed in chamber 360. Further, electro-optic medium 130 is operable to enter an activated state during exposure to an electrical potential and/or field. For example, electro-optic medium 370, may be an electrochromic medium, a twisted nematic medium, or a suspended particle medium. In some embodiments, in an activated state, electro-optic medium 370 may be operable to exhibit a change, relative an un-activated state, in its extinction coefficient at one or more wavelengths in the visible region of the electromagnetic spectrum. In some embodiments, electro-optic medium 370 may be further operable to return to an un-activated state during an absence of an electrical current.

Figure 1C:
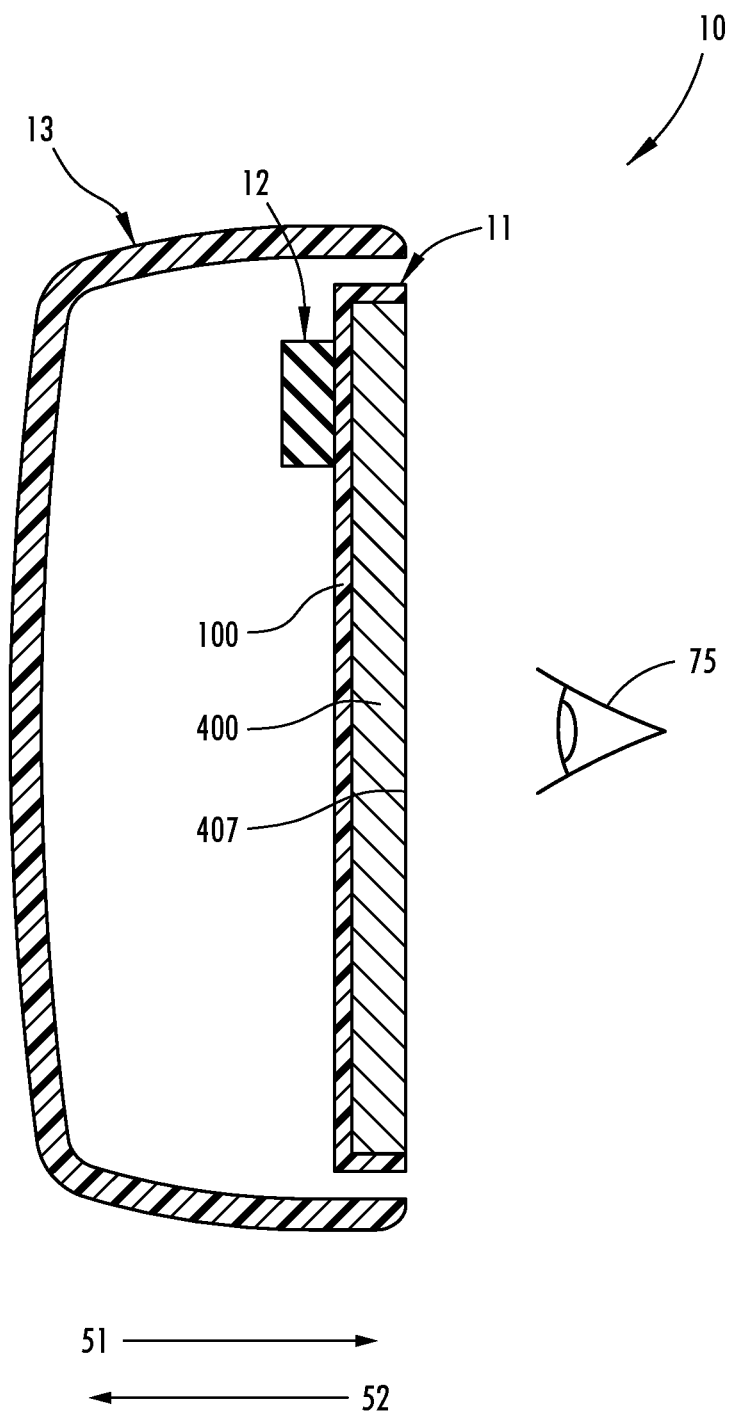
FIG. 1c: A cross-sectional schematic representation of an embodiment of a rearview assembly.

In other embodiments, as shown in FIG. 1c, sub-assembly 11 may comprise a display element 400. Display element 400 is operable to present a digital image. In some embodiments, the image may be of a scene rearward the vehicle. For example, display element 400 may be LCD, LED, OLED, plasma, DLP, or a display of other technology. Further, display element 400 may comprise a seventh surface 407. Seventh surface 407 may be a surface of display element 400 furthest in the first direction 51 through which the image is presented (i.e., displayed). In some embodiments, surface 407 may be touchscreen. Seventh surface 407, for example, may comprise a resistive touch, capacitive touch, or infra-red touch technology. Accordingly, seventh surface 407 may be operable to generate and output a fourth signal corresponding to a touch input from a user 75.

Figure 1D:
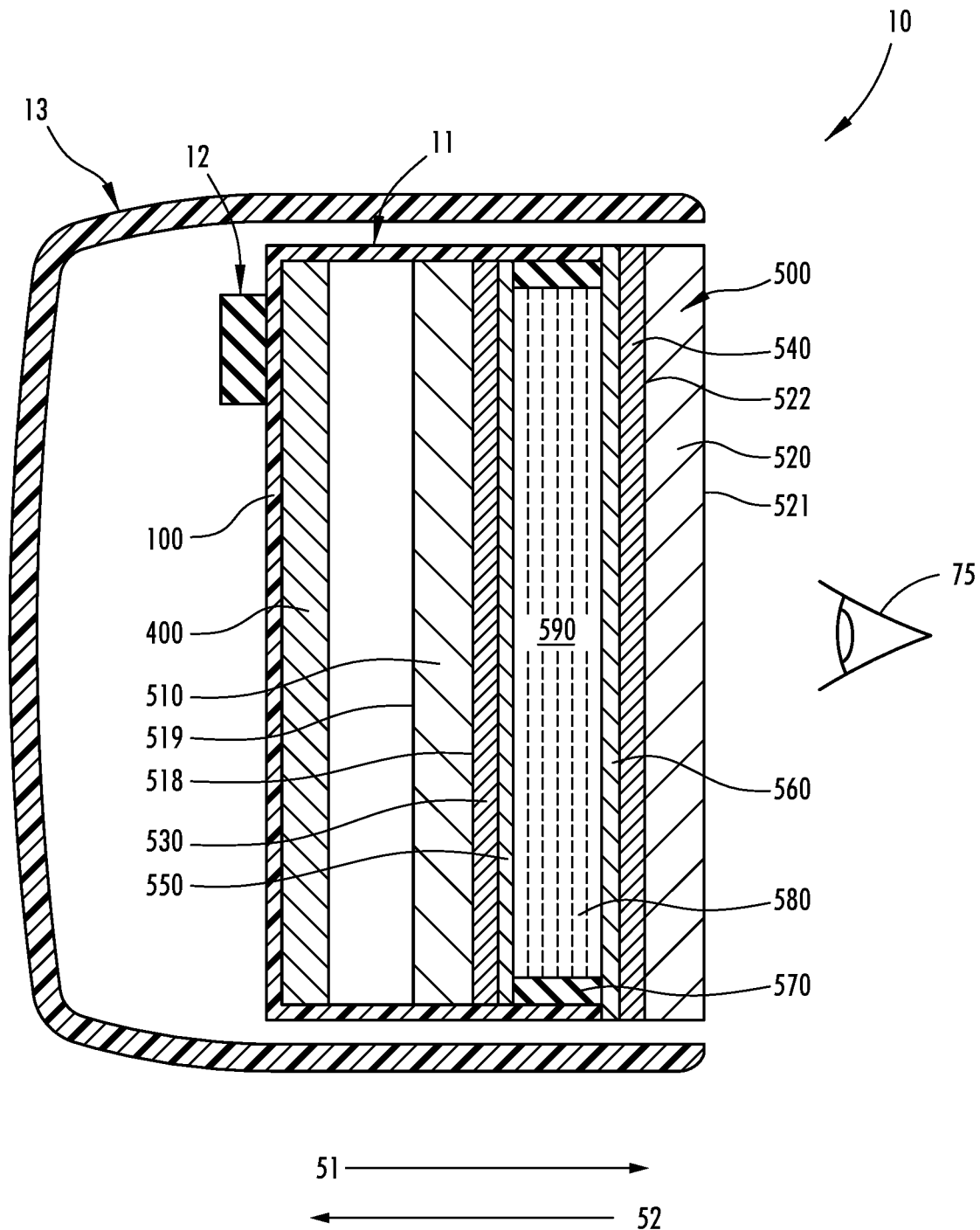
FIG. 1d: A cross-sectional schematic representation of an embodiment of a rearview assembly.

Additionally, in some such embodiments, as shown in FIG. 1d, sub-assembly 11 may further comprise an optical element 500. Optical element 500 may be disposed in the first direction 51 relative display element 400, such that the image displayed by display element 500 may be viewed, by a user 75, through optical element 500. Further, optical element 500 may be disposed in a spaced apart relationship or in abutting contact with display element 400. Optical element 500 may comprise a fourth substrate 510, a fifth substrate 520, a third electrode 530, a fourth electrode 540, a reflective polarizer 550, an absorptive polarizer 560, a second seal 570, and/or a liquid crystal medium 580.

Fourth substrate 510 comprises an eighth surface 518 and a ninth surface 519. Eighth surface 518 may be disposed in the first direction 51 relative ninth surface 519. Fourth substrate 510 is substantially transparent in the visible region of the electromagnetic spectrum. Further, fourth substrate 510 may be fabricated from materials suitable for third substrate 320.

Fifth substrate 520 may be disposed in a spaced apart relationship and in the first direction 51 relative fourth substrate 510. Further, fifth substrate 520 comprises a tenth 521 surface and an eleventh surface 522. Tenth surface 521 may be disposed in the first direction 51 relative eleventh surface 522. Further, fifth substrate 520 is substantially transparent in the visible region of the electromagnetic spectrum. Accordingly, fifth substrate 520 may be fabricated from materials suitable for fourth substrate 510. In some embodiments, tenth surface 521 may be touchscreen. Tenth surface 521, for example, may comprise a resistive touch, capacitive touch, or infra-red touch technology. Accordingly, tenth surface 521 may be operable to generate and output a fourth signal corresponding to a touch input from a user 75.

Third electrode 530 may be disposed between fourth substrate 510 and liquid crystal medium 580. In some embodiments, third electrode 530 may be associated with eighth surface 518. Further, third electrode 530 comprises a substantially transparent, electrically conductive material. Accordingly, the electrically conductive material may be of the same as materials as second electrode 340.

Fourth electrode 540 may be disposed between fifth substrate 520 and liquid crystal medium 580. In some embodiments, third electrode 530 may be associated with eleventh surface 522. Further, fourth electrode 540 comprises a substantially transparent, electrically conductive material. Accordingly, the electrically conductive material may be of the same as materials as third electrode 530.

Reflective polarizer 550 may be disposed between fourth substrate 510 and liquid crystal medium 580. Further, reflective polarizer 550 is a polarization film operable to transmit light of a pre-determined polarization range and reflect light not of the pre-determined polarization range. Additionally, reflective polarizer 550 may be electrically conductive. In embodiments where reflective polarizer 550 is electrically conductive, reflective polarizer 550 and third electrode 530 may be one single entity. Reflective polarizer 550 may be, for example, a wire grid polarizer, a linear polarizer, an elliptical polarizer, or a circular polarizer and may include an optical retarder such as a quarter-wave plate or a half-wave plate. Reflective polarizer 550 may include a polymer-based film structure including at least one optically anisotropic layer. Such polymer-based film structure is generally referred as an antisotropic polymer-based film. Examples of antisotropic polymer-based films are provided by a multi-layered polymer film, including a body of alternating layers of a crystalline-based polymer and another selected polymer, or by micro-structured film-based polarizers, such as brightness enhancement films, or by dual brightness enhancement films.

Absorptive polarizer 560 may be disposed between fifth substrate 520 and liquid crystal medium 580. Further, absorptive polarizer 560 is a polarization filter operable to transmit light of a pre-determined polarization range and absorb light not of the pre-determined polarization range. Additionally, absorptive polarizer 560 may be electrically conductive. In embodiments where absorptive polarizer 560 is electrically conductive, absorptive polarizer 560 and first electrode 530 may be one single entity.

Second seal 570 may be disposed, in a peripheral manner, between at least two of: fourth substrate 510, fifth substrate 520, third electrode 530, second electrode 540, reflective polarizer 550, and absorptive polarizer 560 to define a chamber 590 with at least two thereof. Second seal 570 may comprise any material capable of being adhesively bonded the elements with which it defines chamber 570, such that an liquid crystal medium 580 may not substantially leak therefrom.

Liquid crystal medium 580 may be any substantially transparent medium operable to switch between active and passive active states, wherein in an active state the medium rotates a polarization of light transmitting therethrough and in a passive state the medium does not substantially rotate a polarization of light transmitting therethrough. For example, liquid crystal medium 580 may comprise a twisted pneumatic liquid crystal. Liquid crystal medium 580 is disposed in chamber 590. The activation of liquid crystal medium 590 may occur by creating an electric field therethrough.

Optical element 500 is switchable between two states: a reflective state and a display state. The state of optical element 500 is determined by the creation of an electric field as a result of an electrical potential between third electrode 530 and fourth electrode 540.

In a reflective state, a controller 600 may supply little or no electrical potential between third electrode 530 and fourth electrode 540. As a result of the lack of electrical potential, an electrical field passing through liquid crystal medium 580 is minimal or non-existent and therefore liquid crystal medium 580 is in an active state. In the active state, liquid crystal medium 580 rotates a polarization of light transmitted therethrough.

Accordingly, in a reflective state, light comprising a mixture of many polarizations may enter optical element 500, via tenth surface 521, where it may contact absorptive polarizer 560. Light having a first polarization range may transmit through absorptive polarizer 560 and the light outside of the first polarization range may be absorbed. Thereafter, the light of the first polarization range transmits through liquid crystal medium 580 and is rotated to a second polarization range.

The light of the second polarization range then contacts reflective polarizer 550. Reflective polarizer 150 may transmit light of a third polarization range and reflect light outside of the third polarization range. Further, the second polarization range and the third polarization range are different. Therefore, the light of the second polarization range is reflected back into liquid crystal medium 580—where it is rotated to a fourth polarization range—to the extent the second polarization range is outside the fourth polarization range. The fourth polarization range and the first polarization range may be substantially the same. Thereafter, light of the fourth polarization range within the first polarization range may be transmitted through absorptive polarizer 560. Accordingly, optical element 500 in this state may operate as a mirror and the light reflected therefrom may be viewed by user 75.

In a display state, controller 600 may supply an electrical potential between third electrode 530 and fourth electrode 540. As a result of the electrical potential, an electrical field may be created that passes through liquid crystal medium 580. Therefore, liquid crystal medium 580 is in a passive state. In the passive state, liquid crystal medium 580 allows light to transmit therethrough without a rotation of polarization.

Accordingly, in the display state, display element 400 may emit light to produce an image. When the emitted light encounters reflective polarizer 550, light of the third polarization range transmits therethrough. Thereafter, the emitted light of the third polarization range transmits through liquid crystal medium 580 without a rotation of polarization. The light then may transmit through reflective polarizer 550 to the extent it comprises light of the first polarization range. The third and first polarization ranges may be the same. Accordingly, optical element 500 in this state operates as a display and the light comprising the image may be viewed by user 75.

Figure 1E:
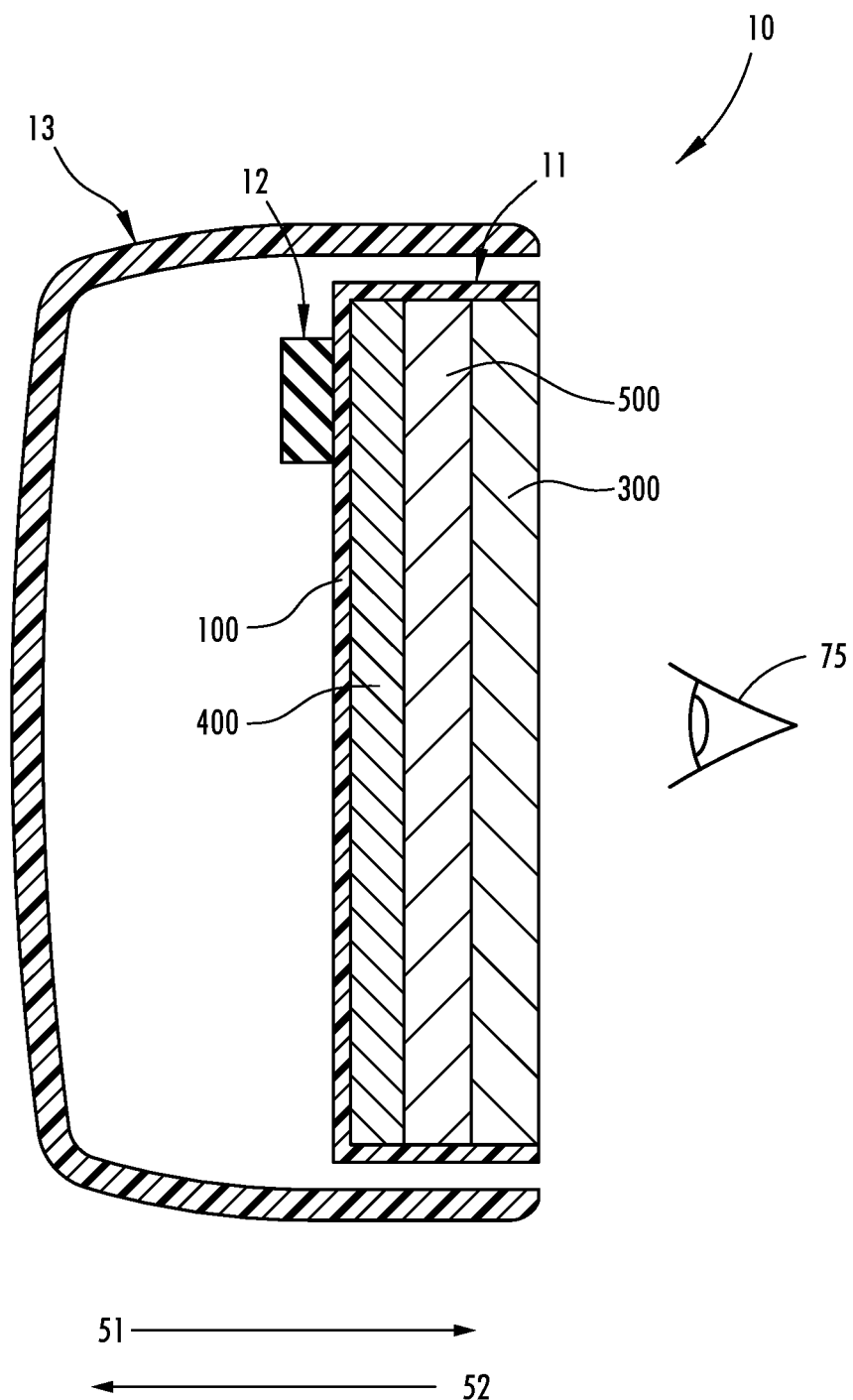
FIG. 1e: A cross-sectional schematic representation of an embodiment of a rearview assembly.

Additionally, as shown in FIG. 1*e*, in embodiments where sub-assembly 11 comprises display element 400 and optical element 500, sub-assembly 11 may further comprise electro-optic element 300. In such an embodiment, electro-optic element 300 may be disposed in first direction 51 relative optical element 500. Electro-optic element 300 and optical element 500 may be in abutting contract. Further, fifth substrate 520 and second substrate 310 may be a single substrate. Additionally, fifth surface 325 may be touchscreen. Fifth surface 325, for example, may comprise a resistive touch, capacitive touch, or infra-red touch technology. Accordingly, fifth surface 325 may be operable to generate and output a fourth signal corresponding to a touch input from a user 75.

Vibration dampener 12 may be physically connected, directly or indirectly, to sub-assembly 11 such that vibration dampener 12 and sub-assembly 11 move as a single entity. Thus, vibration dampener 12 may be coupled to sub-assembly 11 such that they vibrate substantially synchronously. In some embodiments, vibration dampener 12 may be physically connected to carrier 100. Further, vibration dampener 12 may be physically connected to a surface of vibration dampener 12 furthest in a second direction 52. The second direction 52 is opposite the first direction 51. Vibration dampener 12 may comprise an array of piezo-electric sensors. The array of piezo-electric sensors may comprise at least one piezo-electric sensor in each of an x, y, and z direction. A piezo-electric sensor may include a piezo-electric material that is operable to output a first signal upon being mechanically stressed. Accordingly, the first signal may be output in response to sensing a first vibration. Additionally, the piezo-electric material may further be operable to mechanically stress in response to receiving a second signal, resulting in the piezo-electric material moving and/or changing shape. Accordingly, in response to receiving the second signal, the piezo-electric material may vibrate. In some embodiments, at least one of the piezo-electric sensors of the array of piezo-electric sensors is likewise further operable to mechanically stress in response to receiving a third signal. Accordingly, in response to receiving the third signal, the piezo-electric material may vibrate.

Housing 13 may comprise a cavity with an opening in the first direction 51. Accordingly, in some embodiments, sub-assembly 11 and/or vibration dampener 12 may be substantially disposed within the cavity of housing 13. Sub-assembly 11 may be physically connected to housing 13. In some embodiments, however, sub-assembly 11 may have one or more degree of mechanical freedom of movement. Accordingly, sub-assembly 11 may be operable to vibrate independent of housing 13.

In some embodiments, as shown in FIG. 2, rearview assembly 10 may further comprise a controller 600 and/or be a part of a system 20 including a controller 600. Controller 600 may comprise memory 610 and a processor 620. Memory 620 may be operable to store one or more algorithm and processor 620 may be operable to execute the algorithms.

Controller 600 may be communicatively connected to vibration dampener 12. Accordingly, controller 600 may be receive a first signal, respective individual piezo-electric sensors. In such an embodiment, memory 620 may be operable to store one or more vibration dampening algorithm. The vibration dampening algorithm may be operable to process the first signal and generate a second signal based, at least in part, on the first signal. The second signal may determine the second vibration. Further, the second vibration may be substantially out of phase with the first vibration. In some embodiments, the second vibration may be substantially out of phase with the first vibration by a half wave. Therefore, respective each piezo-electric sensor, controller 600 may be operable substantially dampen or cancel the first vibration.

In some embodiments, controller 600 may be communicatively connected to a touchscreen surface of sub-assembly 11. Accordingly, controller 600 may be operable to receive a fourth signal, corresponding to a touch input from user 75. In such an embodiment, memory 620 may be operable to store one or more haptic algorithm. The haptic algorithm may be operable to generate a third signal based at least in part on the fourth signal. Therefore, vibration dampener 12 may be operable to vibrate upon user 75 touching the touchscreen surface, providing haptic feedback.

In some embodiments, controller 600 may be communicatively connected to display element 400. Further, controller 600 may be operable to communicate an image to display element 400. The image may correspond to a scene rearward or to the side of the vehicle. In such an embodiment, controller 600 may be further communicatively connected to an imager 700. Imager 700 may be disposed such that it may capture one or more images of a scene rearward and/or to the side of the vehicle. In such an embodiment, controller 600 may likewise be connected to optical element 500. Accordingly, controller 600 may be operable to switch optical element 500 between substantially transmissive and substantially reflective states in response to display element 400 displaying an image.

Controller 600 may be communicatively connected to electro-optic element 300. Accordingly, controller 600 may be operable to vary the transmittance of light through electro-optic element 300. In such an embodiment, controller 600 may likewise be connected to sensor 800. Sensor 800 may be an imager 700 or an ambient light sensor. Accordingly, controller 600 may be operable to determine a lighting condition and therefore a corresponding likelihood of glare light reflecting from rearview assembly 10. Therefore, controller 600 may vary the transmittance of electro-optic element 300, at least in part, in response to the likelihood of glare and/or lighting condition.

In operation, rearview assembly 10 may experience vibrations, particularly when the vehicle is in motion. Specifically, sub-assembly 11 may experience these vibrations. Further, vibration dampener 12 may experience the same vibrations. Accordingly, a piezo-electric sensor of the vibration dampener 12 may generate a first signal in accordance with an experienced stress caused by the vibration. In turn, controller 600 may receive the first signal and generate a second signal which causes the piezo-electric sensor to vibrate in a pre-determined manner based, at least in part, on the first signal. This vibration in the pre-determined manner may be substantially out of phase with the experienced vibration. Accordingly, the pre-determined vibration may serve to substantially dampen or cancel the experienced vibration. Additionally, a piezo-electric sensor of vibration dampener 12 may vibrate in repose to a touchscreen surface of rearview assembly 10 receiving input from user 75. Accordingly, the rearview assembly 10 may provide user 75 with haptic feedback.

Embodiments of the present disclosure may, accordingly, have the advantage of a reduction or elimination in visible vibrations of rearview assembly 10, reflective element 200, and/or display element 400. The reduction in visible vibration may allow for easier viewing by user 75. This is particularly advantageous as the mass of rearview assembly 10 increases. The mass may often increase with the implementation of features beyond merely display element 400 or reflective element 200—features which may offer their own advantages to rearview assembly 10. Additionally, some embodiments may have the additional advantage of providing haptic feedback to user 75. Haptic feedback may have the advantage of signaling to user 75 when an input has been received.

In this document, relational terms, such as "first," "second," and the like, are used solely to distinguish one entity or action from another entity or action, without necessarily requiring or implying any actual such relationship or order between such entities or actions.

As used herein, the term "and/or," when used in a list of two or more items, means that any one of the listed items can be employed by itself, or any combination of the two or more of the listed items can be employed. For example, if a composition is described as containing components A, B, and/or C, the composition can contain A alone; B alone; C alone; A and B in combination; A and C in combination; A and C in combination; B and C in combination; or A, B, and C in combination.

For purposes of this disclosure, the term "associated" generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

The term "substantially," and variations thereof, will be understood by persons of ordinary skill in the art as describing a feature that is equal or approximately equal to a value or description. For example, a "substantially planar" surface is intended to denote a surface that is planar or approximately planar. Moreover, "substantially" is intended to denote that two values are equal or approximately equal. If there are uses of the term which are not clear to persons of ordinary skill in the art, given the context in which it is used, "substantially" may denote values within about 10% of each other, such as within about 5% of each other, or within about 2% of each other.

The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It is to be understood that although several embodiments are described in the present disclosure, numerous variations, alterations, transformations, and modifications may be understood by one skilled in the art, and the present disclosure is intended to encompass these variations, alterations, transformations, and modifications as within the scope of the appended claims, unless their language expressly states otherwise.

What is claimed is:

1. A rearview assembly comprising:
a sub-assembly whose components are physically coupled and vibrate substantially synchronously, the sub-assembly comprising a reflective element;
an array of piezo-electric sensors coupled to the sub-assembly such that they vibrate substantially synchronously, the array comprising at least one piezo-electric sensor in each of an x, y, and z direction, each piezo-electric sensor operable to output:
a first signal based, at least in part, on sensing a first vibration, and
a second vibration in response to receiving a second signal; and
a controller communicatively connected to the array of piezo-electric sensors, the controller operable, for each of the piezo-electric sensors, to:
receive the first signal,
generate the second signal based, at least in part, on the first signal, the second signal determining the second vibration, the second vibration substantially out of phase with the first vibration, and
communicate the second signal to the piezo-electric sensor;
wherein the second vibration is operable to substantially dampen the first vibration.

2. The rearview assembly of claim 1, wherein the second vibration is substantially out of phase with the first vibration by a half wave.

3. The rearview assembly of claim 1, wherein the sub-assembly further comprises an electro-optic element.

4. The rearview assembly of claim 3, wherein the electro-optic element is an electrochromic element providing the sub-assembly with variable reflectance.

5. The rearview assembly of claim 1, further comprising:
a housing defining a cavity;
wherein the sub-assembly is substantially disposed in the cavity.

6. The rearview assembly of claim 1, wherein:
the sub-assembly further comprises a display element; and
the reflective element is transflective.

7. The rearview assembly of claim 1, wherein the sub-assembly further comprises a touchscreen surface.

8. The rearview assembly of claim 7, wherein:
at least one piezo-electric sensor is operable to output a third vibration in response to receiving a third signal;
the controller is further operable to:
receive a fourth signal from the touchscreen surface, the fourth signal corresponding to a touch input from a user; and
generate the third signal based at least in part, on the fourth signal.

9. The rearview assembly of claim 1, wherein the array of piezo-electric sensors are physically and vibrationally coupled to the sub-assembly such that they vibrate substantially synchronously.

10. The rearview assembly of claim 6, wherein the components of the sub-assembly are physically secured relative one another such that they vibrate together substantially synchronously.

11. A rearview assembly comprising:
a sub-assembly whose components are physically coupled and vibrate substantially synchronously, the sub-assembly comprising a display element, the display element operable to receive and display an image of a scene rearward a vehicle;
an array of piezo-electric sensors coupled to the sub-assembly such that they vibrate substantially synchronously, the array comprising at least one piezo-electric sensor in each of an x, y, and z direction, each piezo-electric sensor operable to output:
a first signal based, at least in part, on sensing a first vibration, and
a second vibration in response to receiving a second signal; and
a controller communicatively connected to the array of piezo-electric sensors, the controller operable, for each of the piezo-electric sensors, to:
receive the first signal,
generate the second signal based, at least in part, on the first signal, the second signal determining the second vibration, the second vibration substantially out of phase with the first vibration, and
communicate the second signal to the piezo-electric sensor;
wherein the second vibration is operable to substantially dampen the first vibration.

12. The rearview assembly of claim 11, wherein the second vibration is out of phase with the first vibration by a half wave.

13. The rearview assembly of claim 11, wherein the sub-assembly further comprises a touchscreen surface.

14. The rearview assembly of claim 13, wherein:
at least one piezo-electric sensor is operable to output a third vibration in response to receiving a third signal;
the controller is further operable to:
receive a fourth signal from the touchscreen surface, the fourth signal corresponding to a touch input from a user; and
generate the third signal based at least in part on the fourth signal.

15. The rearview assembly of claim 11, further comprising an optical element operable to switch between transmissive and reflective states.

16. The rearview assembly of claim 15, wherein the optical element comprises a twisted pneumatic liquid crystal medium.

17. The rearview assembly of claim 15, further comprising an electro-optic element operable to vary the transmittance of light therethrough at one or more wavelengths.

18. The rearview assembly of claim 11, further comprising:
a housing defining a cavity;
wherein the sub-assembly is substantially disposed in the cavity.

19. The rearview assembly of claim 11, wherein the array of piezo-electric sensors are vibrationally coupled to the sub-assembly.

20. The rearview assembly of claim 11, wherein the rearview assembly is an interior rearview assembly.

* * * * *